United States Patent
Kurihara et al.

(10) Patent No.: US 10,107,863 B2
(45) Date of Patent: Oct. 23, 2018

(54) TEST METHOD FOR SECONDARY BATTERY

(71) Applicant: Automotive Energy Supply Corporation, Zama-shi, Kanagawa (JP)

(72) Inventors: Junko Kurihara, Zama (JP); Kenichi Sakai, Zama (JP); Daisuke Iga, Zama (JP); Chika Amemiya, Zama (JP); Hiroaki Tanizaki, Zama (JP)

(73) Assignee: AUTOMOTIVE ENERGY SUPPLY CORPORATION, Zama-Shi, Kanagawa (JP)

( * ) Notice: Subject to any disclaimer, the term of this patent is extended or adjusted under 35 U.S.C. 154(b) by 195 days.

(21) Appl. No.: 14/906,088

(22) PCT Filed: Jul. 24, 2013

(86) PCT No.: PCT/JP2013/069982
§ 371 (c)(1),
(2) Date: Jan. 19, 2016

(87) PCT Pub. No.: WO2015/011794
PCT Pub. Date: Jan. 29, 2015

(65) Prior Publication Data
US 2016/0161564 A1  Jun. 9, 2016

(51) Int. Cl.
*G01R 31/36* (2006.01)
*G01R 31/02* (2006.01)
(Continued)

(52) U.S. Cl.
CPC ....... *G01R 31/3627* (2013.01); *G01R 31/025* (2013.01); *G01R 31/3606* (2013.01);
(Continued)

(58) Field of Classification Search
USPC ...................................... 324/426
See application file for complete search history.

(56) References Cited

FOREIGN PATENT DOCUMENTS

JP  2010-086754 A  4/2010
JP  2012-003952 A  1/2012
(Continued)

OTHER PUBLICATIONS

Extended European Search Report dated Jun. 16, 2016 for the corresponding European Patent Application No. 3889773.1.
(Continued)

*Primary Examiner* — Robert Grant
(74) *Attorney, Agent, or Firm* — Troutman Sanders LLP (57) ABSTRACT

A test method for a secondary battery, which early detects the occurrence of the future micro short-circuiting in the screening and promotes to render the contaminant harmless while suppressing the short-circuiting between the positive and negative electrodes in the aging, is provided. This test method includes Step S12 of charging the secondary battery, Steps S13 and S14 of aging the secondary battery in a first pressed state, Step S17 of measuring a battery voltage (V1) after the aging, Step S18 of screening the secondary battery in a second pressed state with a higher pressure than in the first pressed state, and Step S19 of measuring a battery voltage (V2) after the screening. Whether the battery has the internal short-circuiting or not is determined (Step S20) based on the difference between the voltage (V1) measured in Step S17 and the voltage (V2) measured in Step S19.

2 Claims, 7 Drawing Sheets (51) Int. Cl.
*H01M 10/44* (2006.01)
*H01M 10/48* (2006.01)
*H01M 10/42* (2006.01)

(52) U.S. Cl.
CPC ......... *H01M 10/42* (2013.01); *H01M 10/446* (2013.01); *H01M 10/48* (2013.01); *G01R 31/362* (2013.01); *H01M 10/4285* (2013.01)

(56) References Cited

FOREIGN PATENT DOCUMENTS

| | | | |
|---|---|---|---|
| JP | 2012084346 | * | 4/2012 |
| JP | 2012084346 A | | 4/2012 |
| JP | 2012-104276 A | | 5/2012 |

OTHER PUBLICATIONS

PCT International Search Report dated Oct. 8, 2013, issued in corresponding PCT Application No. PCT/JP2013/066475.
PCT International Search Report dated Oct. 8, 2013, issued in corresponding PCT Application No. PCT/JP2013/069982.

* cited by examiner

FIG. 7

TEST METHOD FOR SECONDARY BATTERY

CROSS-REFERENCE TO RELATED APPLICATIONS

This application is a U.S. National Phase Application under 35 U.S.C. § 371 of International Patent Application No. PCT/JP 2013/069982 filed Jul. 24, 2013, the entire contents of which are hereby incorporated herein by reference.

TECHNICAL FIELD

The present invention relates to a test method for a secondary battery, which is for testing the internal short-circuiting of a secondary battery.

BACKGROUND ART

Some tests for secondary batteries include screening (self-discharge test) for eliminating the self-discharge defect of the secondary battery. For example, as disclosed in Patent Literature 1, it has been known that screening is performed in a pressed state, whereby the micro short-circuiting can be found in a short period of time.

Moreover, as disclosed in Patent Literature 2, it has been known that aging is performed while pressure is applied in order to find the micro short-circuiting in a secondary battery in a short period of time.

CITATION LIST

Patent Literature

PATENT LITERATURE 1: JP-A-2012-104276
PATENT LITERATURE 2: JP-A-2010-86754

SUMMARY OF THE INVENTION

Problems to be Solved by the Invention

Applying pressure in the aging step in a manner similar to that in the screening in a secondary battery, however, makes the positive electrode and the negative electrode too close. In this case, the contaminant metal is more likely to be deposited again in a thin shape onto the negative electrode. Further, the effect of making harmless in the aging may be deteriorated.

The above problem is solved by the present invention. An object of the present invention is to provide a test method for a secondary battery, which early detects the occurrence of the future micro short-circuiting in the screening and promotes to render the contaminant harmless while suppressing the short-circuiting between the positive and negative electrodes in the aging.

Solutions to the Problems

A test method for a secondary battery according to the present invention in order to solve the above problem is a test method for a secondary battery including an electrolyte solution and an electrode stack having a positive electrode material and a negative electrode material alternately stacked with a separator interposed therebetween, the electrolyte solution and the electrode stack being housed in a sealed case, the method including: a charging step of charging the secondary battery; a step of aging the secondary battery in a first pressed state; a first voltage measurement step of measuring a battery voltage after the aging; a step of screening the secondary battery in a second pressed state with a higher pressure than in the second pressed state; and a second voltage measurement step of measuring the battery voltage after the screening, wherein whether the battery has the internal short-circuiting or not is determined based on the difference between the voltage measured in the first voltage measurement step and the voltage measured in the second voltage measurement step.

Effects of the Invention (1) According to the invention recited in clams 1 to 3, the aging is performed in the first pressed state with a lower pressure than in the second pressed state in the screening. Thus, the distance between the positive and negative electrodes does not become too narrow. Accordingly, the short-circuiting can be suppressed. In addition, the screening is performed in the second pressed state with a higher pressure than in the first pressed state. Therefore, the distance between the positive and negative electrodes can be narrowed. As a result, the micro short-circuiting can be detected early.

BRIEF DESCRIPTION OF THE DRAWINGS

FIGS. 7 illustrate a secondary battery to which the present invention is applied, in which

DESCRIPTION OF EMBODIMENTS

Figure 7:
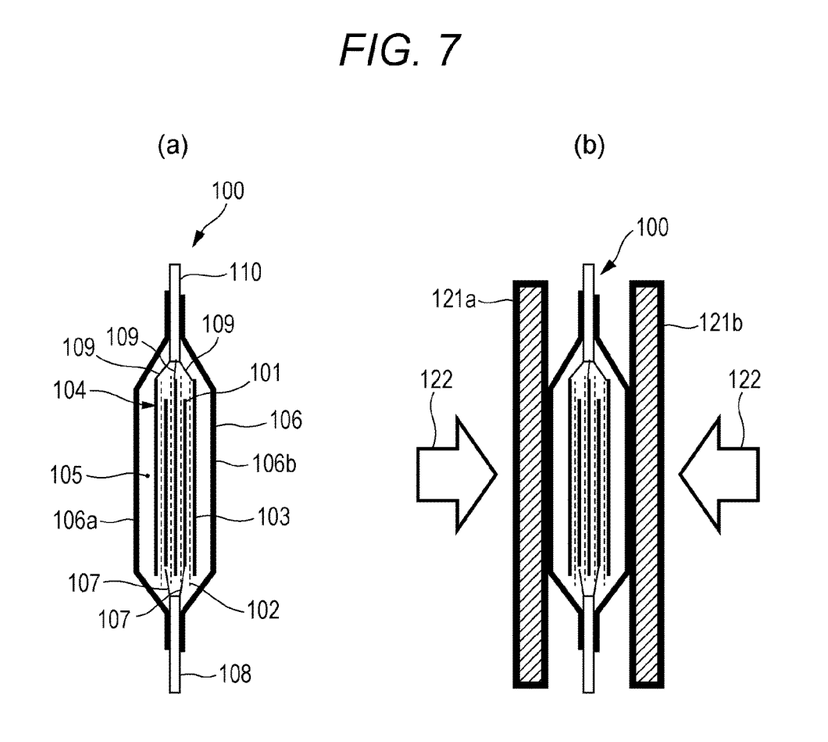
FIG. 7(a) is a sectional view and FIG. 7(b) is a sectional view including a pressing unit.

An embodiment of the present invention will be described below with reference to the drawings. The present invention is, however, not limited to the embodiment below. FIGS. 7 illustrate an example of a battery cell of a secondary battery to which the present invention is applied. In FIG. 7(a), a battery cell 100 has a structure as below.

An electrode stack 104 having a plurality of positive electrode materials 101, a plurality of separators 102, and a plurality of negative electrode materials 103, which are alternately stacked, is housed in a laminated film covering 106 together with an electrolyte solution 105.

The positive electrode material 101 is connected to one end of a positive electrode terminal 108 through a positive electrode lead 107. The negative electrode material 103 is connected to one end of a negative electrode terminal 110 through a negative electrode lead 109.

The other end of each of the positive electrode terminal 108 and the negative electrode terminal 110 extends out of the sealed laminated film covering 106.

FIG. 7(b) illustrates the state in which the secondary battery (battery cell 100) according to the embodiment is pressed.

In FIG. 7(b), an outer peripheral surface 106a of the laminated film covering 106 on one end of the electrode stack 104 in the stacking direction is provided with a pressing plate 121a. In addition, an outer peripheral surface 106b of the laminated film covering 106 on the other end of the electrode stack 104 in the stacking direction is provided with a pressing plate 121b. A pressing unit 122 applies pressure to the pressing plates 121a and 121b in a direction toward the electrode stack 104.

The structure of the secondary battery and the pressing unit to which the present invention is applied is not limited to that illustrated in FIGS. 7.

Example 1

Examples 1 to 6 will be described on the premise that the steps up to the step of housing the electrode stack 104 of FIGS. 7 in the laminated film covering 106 have been completed in the process for manufacturing a secondary battery.

Figure 1:
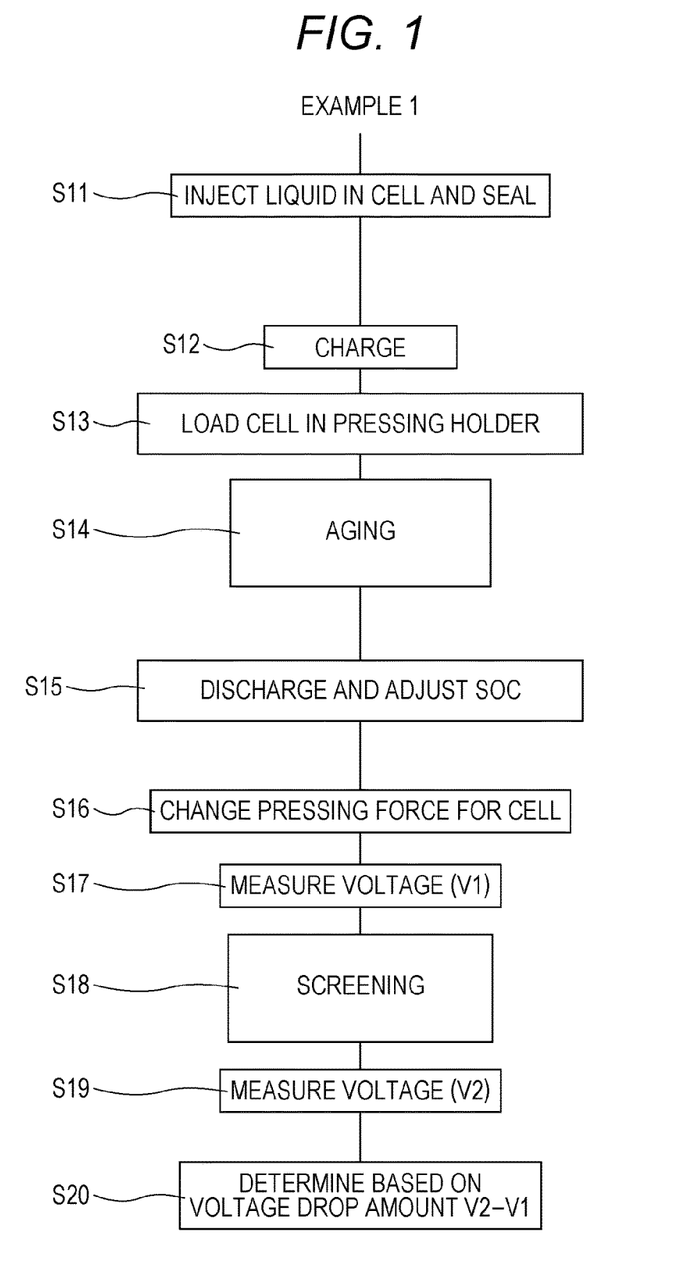
FIG. 1 is a flowchart illustrating a method according to Example 1 in the present invention.

The process in Example 1 is carried out in accordance with the flowchart in FIG. 1.

First, in Step S11, the electrolyte solution 105 is injected into the battery cell 100 and then the laminated film covering 106 is sealed.

In Step S12, the battery cell 100 is initially charged, thereby setting the battery cell 100 in the fully charged state (SOC 100%).

In Step S13, the charged battery cell 100 is loaded in a pressing holder. Then, the pressing force of the pressing unit 122 illustrated in FIG. 7(b) is set to a first pressing force, which is smaller than a second pressing force in the screening described below, for example to 2 N/m².

In Step S14, the aging is performed at the first pressuring force set in Step S13.

In Step S15, the battery cell 100 is discharged, thereby adjusting SOC. SOC is, for example, 10%. SOC is, however, not limited thereto and is preferably 5 to 50%.

In Step S16, the pressing force of the pressing holder is set to the second pressing force, which is larger than the first pressing force, for example to 40 N/m². In Step S17, the voltage (V1) of the battery cell 100 is measured.

In Step S18, the screening is performed by self-discharging the battery cell 100 at the second pressing force, for example at 40 N/m².

In Step S19, the voltage (V2) of the battery cell 100 after the self-discharge is measured.

In Step S20, whether the battery has the internal short-circuiting or not is determined. This determination is made based on the difference between the voltage V1 before the self-discharge measured in Step S17 and the voltage V2 after the self-discharge measured in Step S19, i.e., based on the voltage drop amount V2–V1. For example, if the difference between the measured voltage V1 and the measured voltage V2 is smaller than a set threshold, it is determined that the short-circuiting has not occurred and the product is determined as "non-defective product." If the difference is larger than the threshold, it is determined that the short-circuiting has occurred and the product is determined as "defective product."

According to the test method in Example 1, the pressing force in the aging (Step S14) is small, thereby preventing the electrodes from getting too close. This can extend the range where the contaminant metal can elute become. As a result, the re-deposition of the contaminant metal onto the negative electrode is suppressed. Even if the contaminant metal is deposited again, the metal is separated with the large bottom surface (in the thick state) and thereby the deposition length becomes shorter. Accordingly, the deposition does not grow to the length which leads to the short-circuiting. As a result, it is possible to prevent the short-circuiting. In addition, the pressing force in the screening (Step S18) is large. This can narrow the distance between the electrodes. Therefore, the micro short-circuiting can be found out early.

Example 2

Figure 2:
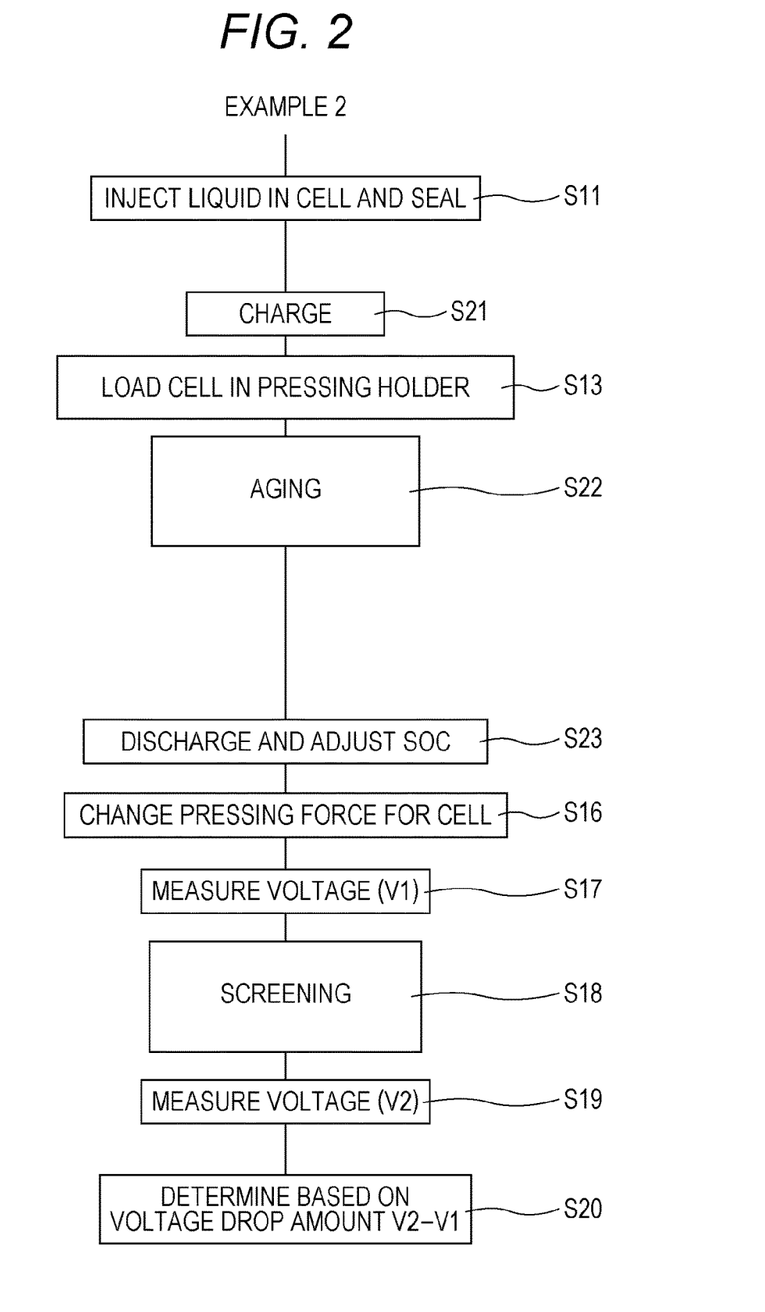
FIG. 2 is a flowchart illustrating a method according to Example 2 in the present invention.

The process in Example 2 is performed in accordance with the flowchart in FIG. 2. Step with the same step number is the same as that in Example 1. Therefore, the detailed description on the same step is omitted.

First, in Step S11, the electrolyte solution 105 is injected into the battery cell 100 and then the laminated film covering 106 is sealed. In Step S21, the battery cell 100 is charged until the charging voltage attains a first charging voltage, which is higher than a second charging voltage described below. The charging voltage is, for example, SOC 100%.

In Step 13, the charged battery cell 100 is loaded in the pressing holder. The pressing force of the pressing unit 122 of FIG. 7(b) is set to the first pressuring force, which smaller than the second pressing force in the screening described below, for example, to 2 N/m².

In Step S22, the aging is performed at the first pressuring force set in Step S13.

In Step S23, the battery cell 100 is discharged to adjust SOC. For example, SOC is 10%. SOC is, however, not limited thereto and is preferably 5 to 50%.

In Step S16, the pressing force of the pressing holder is set to the second pressing force, which is larger than the first pressing force. In Step S17, the voltage (V1) of the battery cell 100 is measured.

In Step S18, the battery cell 100 is self-discharged and subjected to the screening by setting the second pressing force to 40 N/m² in the second charging voltage state, which is lower than the first charging voltage in Step S21.

In Step S19, the voltage (V2) of the battery cell 100 after the self-discharge is measured.

In Step S20, whether the battery has the internal short-circuiting or not is determined. This determination is made based on the difference between the voltage V1 before the self-discharge measured in Step S17 and the voltage V2 after the self-discharge measured in Step S19, i.e., based on the voltage drop amount V2–V1. For example, if the difference between the measured voltage V1 and the measured voltage V2 is smaller than a set threshold, it is determined that the short-circuiting has not occurred and the product is determined as "non-defective product." If the difference is larger than the threshold, it is determined that the short-circuiting has occurred and the product is determined as "defective product."

According to the test method in Example 2, the pressing force in the aging (Step S22) is small and the battery cell is in the state of being charged at a predetermined voltage. Therefore, in addition to the effect in Example 1, the separation due to the contaminant can be performed sufficiently while the short-circuiting between the positive and negative electrodes is suppressed. This can render the contaminant metal harmless. In addition, the pressing force in the screening (Step S18) is large and the battery cell is in the state of being charged at the low voltage. Therefore, the micro short-circuiting that might occur in the future can be detected early. Even in the occurrence of the short-circuiting, the test can be carried out safely.

Example 3

Figure 3:
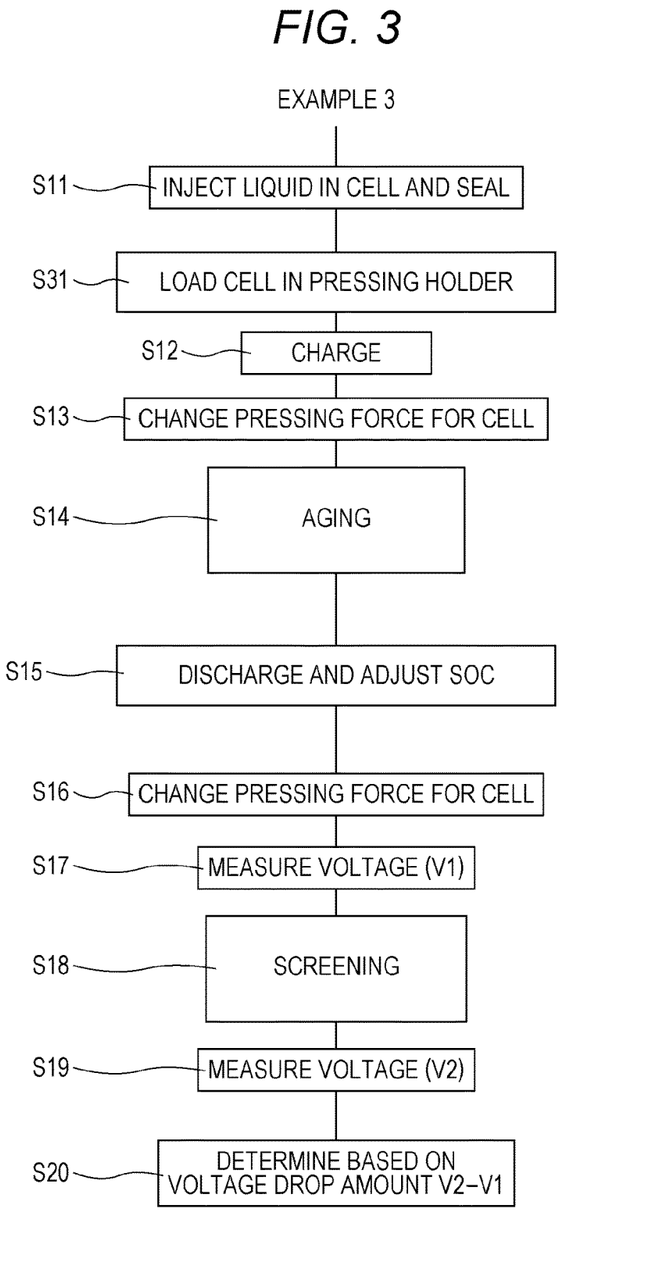
FIG. 3 is a flowchart illustrating a method according to Example 3 in the present invention.

The process in Example 3 is carried out in accordance with the flowchart in FIG. 3.

First, in Step S11, the electrolyte solution 105 is injected into the battery cell 100 and then the laminated film covering 106 is sealed.

In Step S31, the battery cell 100 is loaded in the pressing holder. For example, the pressing force of the pressing unit 122 in FIG. 7(b) is set to a third pressing force, which is larger than the first pressing force in the aging described below and smaller than the second pressing force in the screening, for example to 10 N/m².

In Step S12, the battery cell 100 is initially charged, thereby setting the battery cell 100 in the fully charged state (SOC 100%).

In Step S13, the pressing force in the pressing holder is set to the first pressing force smaller than the third pressing force, for example, to 2 N/m².

In Step S14, the aging is performed at the first pressing force set in Step S13.

In Step S15, the battery cell 100 is discharged to adjust SOC. For example, SOC is 10%. SOC is, however, not limited thereto and is preferably 5 to 50%.

In Step S16, the pressing force of the pressing holder is set to the second pressing force larger than the first pressing force. In Step S17, the voltage (V1) of the battery cell 100 is measured.

In Step S18, the battery cell 100 is self-discharged and subjected to the screening at the second pressing force, for example at 40 N/m².

In Step S19, the voltage (V2) of the battery cell 100 after the self-discharge is measured.

In Step S20, whether the battery has the internal short-circuiting or not is determined. This determination is made based on the difference between the voltage V1 before the self-discharge measured in Step S17 and the voltage V2 after the self-discharge measured in Step S19, i.e., based on the voltage drop amount V2−V1. For example, if the difference between the measured voltage V1 and the measured voltage V2 is smaller than a set threshold, it is determined that the short-circuiting has not occurred and the product is determined as "non-defective product." If the difference is larger than the threshold, it is determined that the short-circuiting has occurred and the product is determined as "defective product."

According to the test method in Example 3, the pressing force in the charging step (Step S12) is larger than that in the aging (Step S14). Thus, in addition to the effect in Example 1, the charging is possible with the distance between the electrodes maintained uniform. Further, the pressing force in the screening (Step S18) is larger than that in the charging. Thus, the micro short-circuiting can be detected early.

Example 4

Figure 4:
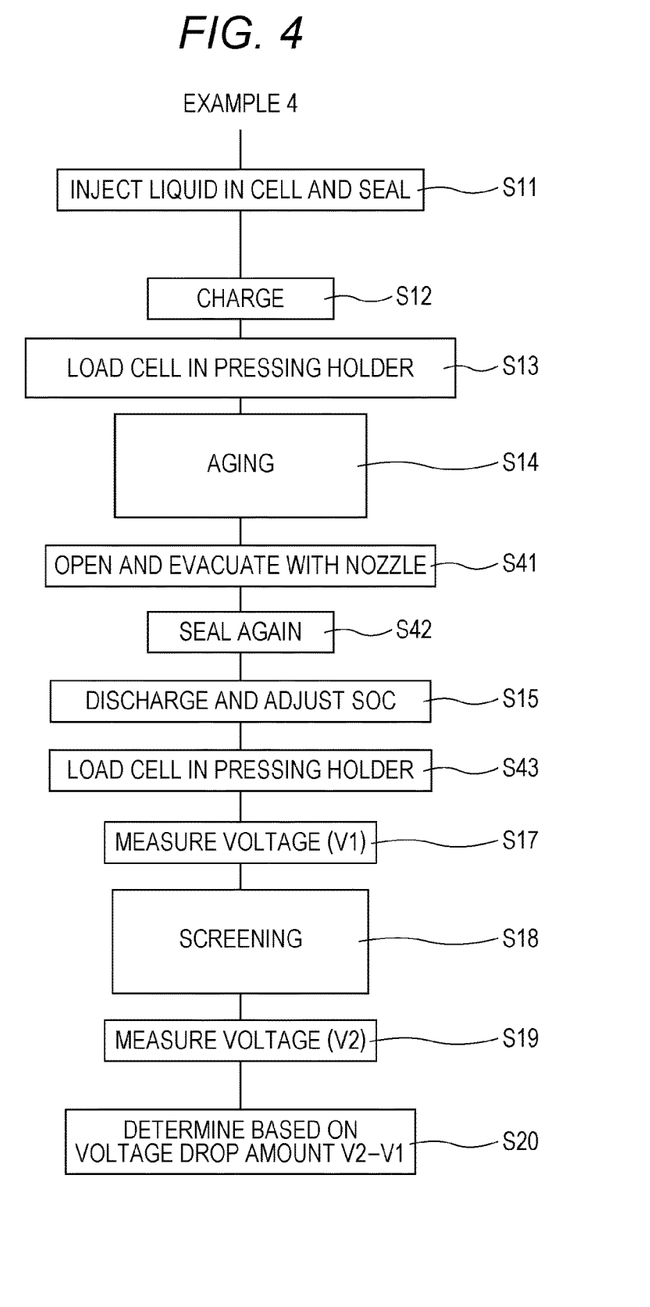
FIG. 4 is a flowchart illustrating a method according to Example 4 in the present invention.

The process in Example 4 is carried out in accordance with the flowchart in FIG. 4.

First, in Step S11, the electrolyte solution 105 is injected into the battery cell 100 and then the laminated film covering 106 is sealed.

In Step S12, the battery cell 100 is initially charged, thereby setting the battery cell 100 in the fully charged state (SOC 100%).

In Step S13, the battery cell 100 is loaded in the pressing holder. For example, the pressing force of the pressing unit 122 in FIG. 7(b) is set to the first pressing force, which is smaller than the second pressing force in the screening described below, for example to 2 N/m².

In Step S14, the aging is performed at the first pressing force set in Step S13.

In Step S41, the laminated film covering 106 is opened. Then, the battery cell 100 is evacuated with a nozzle, thereby degassing the battery cell 100. After that, in Step 42, the laminated film covering 106 is sealed again.

In Step S15, the battery cell 100 is discharged to adjust SOC. For example, SOC is 10%. SOC is, however, not limited thereto and is preferably 5 to 50%.

In Step S43, the battery cell 100 is loaded in the pressing holder.

In Step S17, the voltage (V1) of the battery cell 100 is measured.

In Step S18, the battery cell 100 is self-discharged at the second pressing force larger than the first pressing force, for example at 40 N/m², thereby performing the screening.

In Step S19, the voltage (V2) of the battery cell 100 after the self-discharge is measured.

In Step S20, whether the battery has the internal short-circuiting or not is determined. This determination is made based on the difference between the voltage V1 before the self-discharge measured in Step S17 and the voltage V2 after the self-discharge measured in Step S19, i.e., based on the voltage drop amount V2−V1. For example, if the difference between the measured voltage V1 and the measured voltage V2 is smaller than a set threshold, it is determined that the short-circuiting has not occurred and the product is determined as "non-defective product." If the difference is larger than the threshold, it is determined that the short-circuiting has occurred and the product is determined as "defective product."

According to the test method in Example 4, in addition to the effect of Example 1, the result variation due to the gas in the screening (Step S18) is suppressed owing to the degassing. Thus, the higher accuracy can be expected.

Example 5

Figure 5:
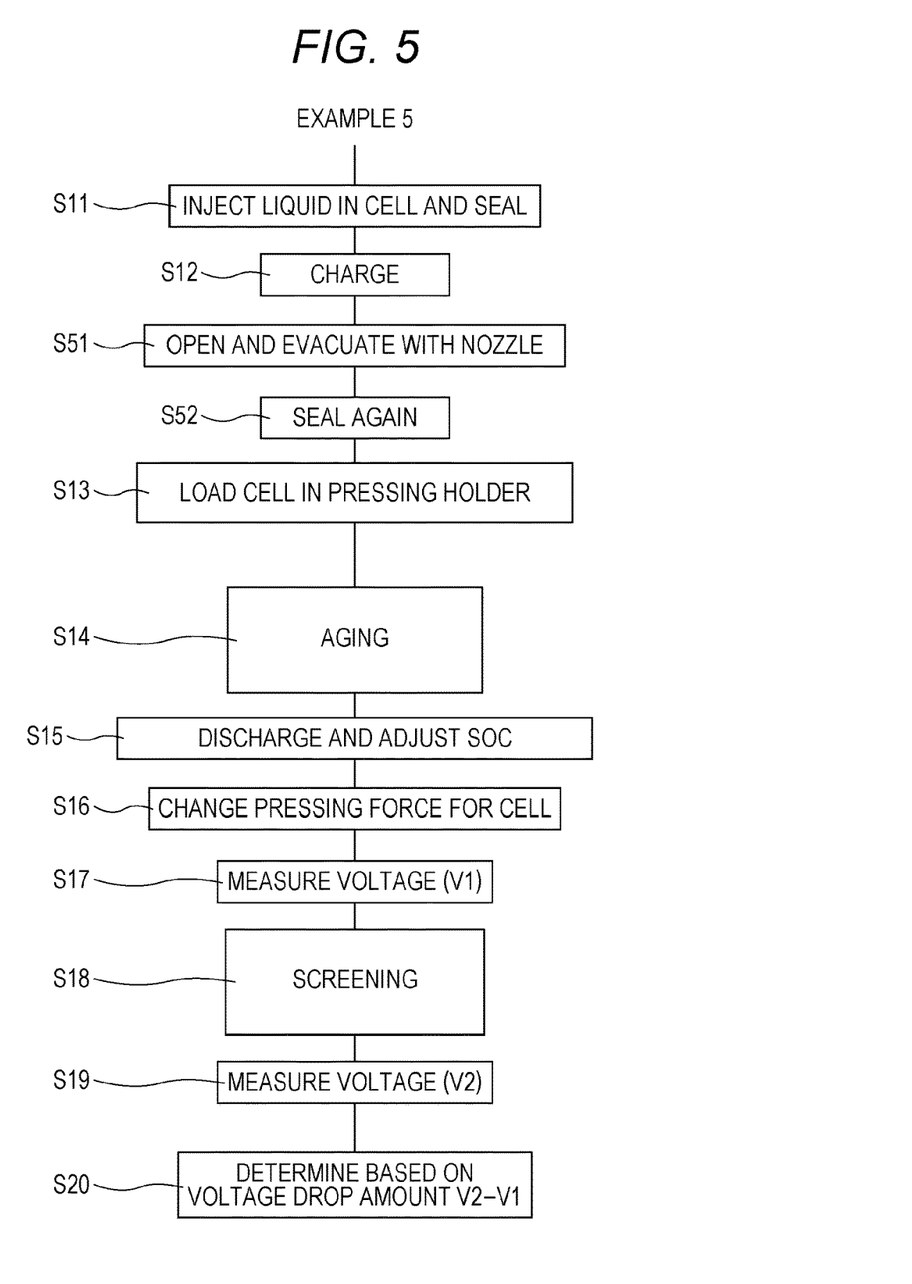
FIG. 5 is a flowchart illustrating a method according to Example 5 in the present invention.

The process in Example 5 is carried out in accordance with the flowchart of FIG. 5.

First, in Step S11, the electrolyte solution 105 is injected into the battery cell 100 and then the laminated film covering 106 is sealed.

In Step S12, the battery cell 100 is initially charged, thereby setting the battery cell 100 in the fully charged state (SOC 100%).

In Step S51, the laminated film covering 106 is opened. Then, the battery cell 100 is evacuated with a nozzle, thereby degassing the battery cell 100. After that, in Step 52, the laminated film covering 106 is sealed again.

In Step S13, the battery cell 100 sealed again is loaded in the pressing holder. Then, for example, the pressing force of the pressing unit 122 in FIG. 7(b) is set to the first pressing force smaller than the second pressing force in the screening described below, for example to 2 N/m².

In Step S14, the aging is performed at the first pressing force set in Step S13, for example at 2 N/m².

In Step S15, the battery cell 100 is discharged to adjust SOC. For example, SOC is 10%. SOC is, however, not limited thereto and is preferably 5 to 50%.

In Step S16, the pressing force in the pressing holder is set to the second pressing force larger than the first pressing force. In Step S17, the voltage (V1) of the battery cell 100 is measured.

In Step S18, the battery cell 100 is self-discharged and subjected to the screening at the second pressing force, for example at 40 N/m$^2$. SOC in the screening is, for example, 10%. SOC is, however, not limited thereto and is preferably 5 to 50%.

In Step S19, the voltage (V2) of the battery cell 100 after the self-discharge is measured.

In Step S20, whether the battery has the internal short-circuiting or not is determined. This determination is made based on the difference between the voltage V1 before the self-discharge measured in Step S17 and the voltage V2 after the self-discharge measured in Step S19, i.e., based on the voltage drop amount V2−V1. For example, if the difference between the measured voltage V1 and the measured voltage V2 is smaller than a set threshold, it is determined that the short-circuiting has not occurred and the product is determined as "non-defective product." If the difference is larger than the threshold, it is determined that the short-circuiting has occurred and the product is determined as "defective product."

According to the test method in Example 5, in addition to the effect of Example 1, the result variation due to the gas in the screening (Step S18) is suppressed owing to the degassing. Thus, the higher accuracy can be expected. In addition, the effect of rendering the contaminant metal harmless due to the aging can be enhanced.

Example 6

Figure 6:
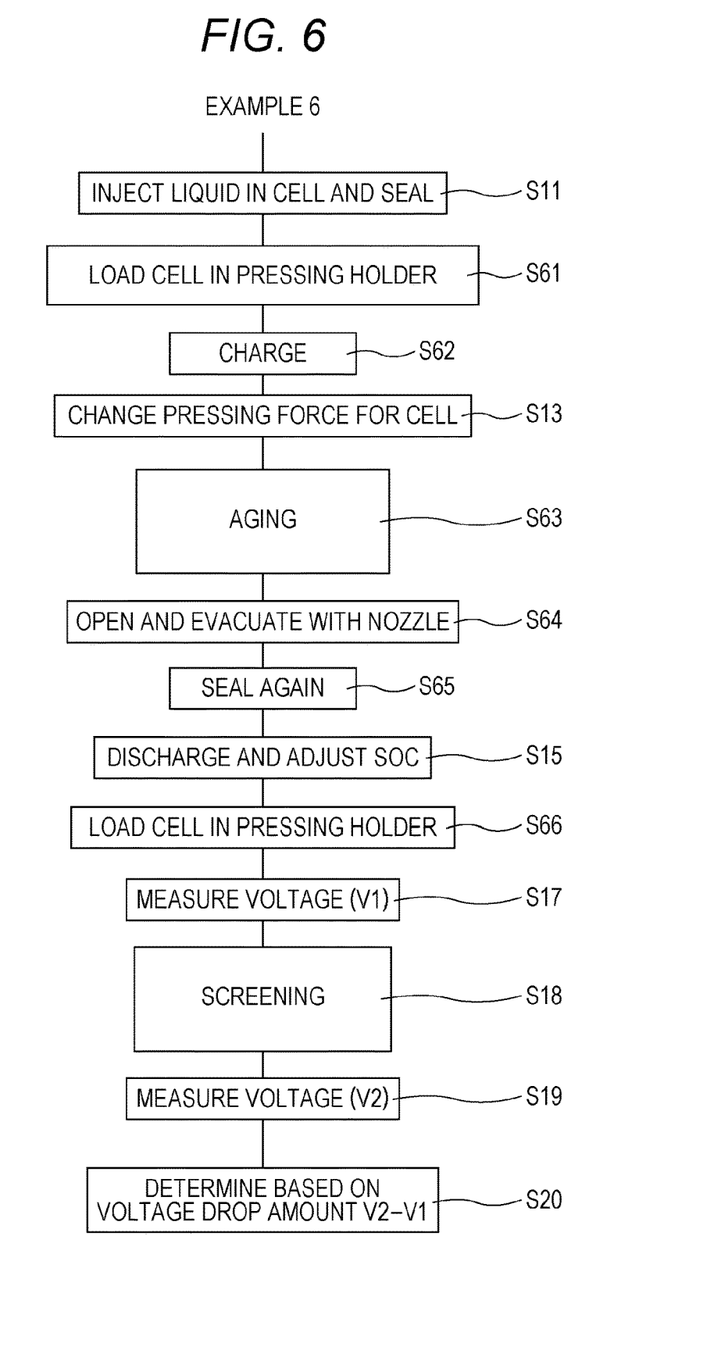
FIG. 6 is a flowchart illustrating a method according to Example 6 in the present invention.

The process in Example 6 is carried out in accordance with the flowchart of FIG. 6.

First, in Step S11, the electrolyte solution 105 is injected into the battery cell 100 and then the laminated film covering 106 is sealed.

In Step S61, the battery cell 100 is loaded in the pressing holder. Then, for example, the pressing force of the pressing unit 122 in FIG. 7(b) is set to the third pressing force, which is larger than the first pressing force in the aging described below and smaller than the second pressing force in the screening, for example to 10 N/m$^2$.

In Step S62, the battery cell 100 is initially charged, thereby setting the battery cell 100 in the fully charged state (SOC 100%).

In Step S13, the pressing force in the pressing holder is set to the first pressing force smaller than the third pressing force, for example to 2 N/m$^2$.

In Step S63, the aging is performed at the first pressing force set in Step S13.

In Step S64, the laminated film covering 106 is opened. Then, the battery cell 100 is evacuated with a nozzle, thereby degassing the battery cell 100. After that, in Step 65, the laminated film covering 106 is sealed again.

In Step S15, the battery cell 100 is discharged to adjust SOC. For example, SOC is 10%. SOC is, however, not limited thereto and is preferably 5 to 50%.

In Step S66, the battery cell 100 is loaded in the pressing holder.

In Step S17, the voltage (V1) of the battery cell 100 is measured.

In Step S18, the screening is performed by self-discharging the battery cell 100 at the second pressing force larger than the first and second pressing forces, for example, at 40 N/m$^2$.

In Step S19, the voltage (V2) of the battery cell 100 after the self-discharge is measured.

In Step S20, whether the battery has the internal short-circuiting or not is determined. This determination is made based on the difference between the voltage V1 before the self-discharge measured in Step S17 and the voltage V2 after the self-discharge measured in Step S19, i.e., based on the voltage drop amount V2−V1. For example, if the difference between the measured voltage V1 and the measured voltage V2 is smaller than a set threshold, it is determined that the short-circuiting has not occurred and the product is determined as "non-defective product." If the difference is larger than the threshold, it is determined that the short-circuiting has occurred and the product is determined as "defective product."

According to the test method in Example 6, in addition to the effect of Examples 2 and 3, the result variation due to the gas in the screening (Step S18) is suppressed owing to the degassing. Thus, the higher accuracy can be expected.

No pressure may be applied as the first pressing force in Examples 1 to 6 (atmospheric pressure).

The invention claimed is:

1. A test method for a secondary battery including an electrolyte solution and an electrode stack having a positive electrode material and a negative electrode material alternately stacked with a separator interposed therebetween, the electrolyte solution and the electrode stack being housed in a sealed case, the method comprising:
    a step of aging the secondary battery in a first pressed state;
    a first voltage measurement step of measuring a battery voltage of the secondary battery after the aging step;
    a step of screening the secondary battery in a second pressed state with a higher pressure than in the first pressed state;
    a charging step of charging the secondary battery, wherein the charging step is performed in a third pressed state with a higher pressure than in the first pressed state and a lower pressure than in the second pressed state;
    a second voltage measurement step of measuring the battery voltage of the secondary battery after the screening step; and
    testing the secondary battery based on the voltage measured in the first voltage measurement step and the voltage measured in the second voltage measurement step.

2. The test method for a secondary battery according to claim 1, further comprising a step of degassing the secondary battery by opening the secondary battery before or after the aging step.

* * * * *